(12) United States Patent
Kubota

(10) Patent No.: US 7,345,420 B2
(45) Date of Patent: Mar. 18, 2008

(54) ORGANIC ELECTROLUMINESCENCE DISPLAY PANEL AND METHOD FOR MANUFACTURING THE SAME

(75) Inventor: Hirofumi Kubota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 191 days.

(21) Appl. No.: 10/508,857

(22) PCT Filed: Mar. 19, 2003

(86) PCT No.: PCT/JP03/03311

§ 371 (c)(1),
(2), (4) Date: May 13, 2005

(87) PCT Pub. No.: WO03/081954

PCT Pub. Date: Oct. 2, 2003

(65) Prior Publication Data

US 2005/0218796 A1 Oct. 6, 2005

(30) Foreign Application Priority Data

Mar. 25, 2002 (JP) .............................. 2002-082512

(51) Int. Cl.
*H01J 1/62* (2006.01)
(52) U.S. Cl. ...................... 313/506; 313/504; 428/690
(58) Field of Classification Search ................ 313/498, 313/504, 506, 512; 428/690, 917
See application file for complete search history.

(56) References Cited

U.S. PATENT DOCUMENTS 6,198,217 B1* 3/2001 Suzuki et al. ............... 313/504
6,680,131 B1* 1/2004 Ishibashi et al. ............. 428/690
6,897,607 B2* 5/2005 Sugimoto et al. ........... 313/506
2001/0044035 A1* 11/2001 Morii ........................ 428/690

FOREIGN PATENT DOCUMENTS

| JP | 4-137483 | 5/1992 |
| --- | --- | --- |
| JP | 7-211455 | 8/1995 |
| JP | 9-161967 | 6/1997 |
| JP | 10-247587 | 9/1998 |
| JP | 2000-68050 | 3/2000 |
| JP | 2002-25765 | 1/2002 |
| JP | 2002-117973 | 4/2002 |

\* cited by examiner

*Primary Examiner*—Sandra O'Shea
*Assistant Examiner*—Bao Q. Truong
(74) *Attorney, Agent, or Firm*—Drinker Biddle & Reath LLP

(57) ABSTRACT

An organic electroluminescent display panel includes one or more organic electroluminescent elements and a substrate supporting them. Each organic electroluminescent element has first and second display electrodes and one or more organic functional layers of organic compounds sandwiched and layered between the first and second display electrodes, the organic functional layers including a light-emitting layer. Such display panel has a high-molecular compound film covering the organic electroluminescent elements and a surface of the substrate around the one or more organic electroluminescent elements; and an inorganic barrier film covering the high-molecular compound film, an edge thereof, and a surface of the substrate around the high-molecular compound film.

3 Claims, 6 Drawing Sheets

ORGANIC ELECTROLUMINESCENCE DISPLAY PANEL AND METHOD FOR MANUFACTURING THE SAME

TECHNICAL FIELD

The present invention relates to an organic electroluminescent element (hereinafter referred to as an organic EL element) comprising one or more organic thin films (hereinafter referred to as an organic functional layer) including a light-emitting layer consisting of organic compound material which exhibits electroluminescence when electrical current is injected thereto. More particularly, the present invention relates to an electroluminescent display panel (hereinafter referred to as organic EL display panel) with one or more organic EL elements formed on a substrate.

BACKGROUND ART

The organic EL element fundamentally comprises an anode and a cathode with one or more organic functional layers layered between them. In the light-emitting layer of the organic EL element, an electron and a hole injected from both electrodes recombine with each other to form an exciton. When the exciton changes its state from an excited state to a basic state, it emits light. For example, an organic EL element has an anodic transparent electrode, an organic functional layer, and a cathodic metal electrode, which are sequentially deposited on a transparent substrate so as to emit light through the transparent substrate side. The organic functional layer can be formed in a laminate form of a single light-emitting layer, or of a three-layer structure which includes an organic hole transport layer, a light-emitting layer and an organic electron transport layer, or of a two-layer structure which includes an organic hole transport layer and a light-emitting layer. At least one of an electron injection layer, a hole injection layer and a carrier block layer may be inserted among the above-mentioned layered layers and both electrodes.

As organic EL display panels, for example, the matrix display type and the panel having a predetermined luminescence pattern are well known.

When this organic EL element is exposed to the atmosphere, it is easily degraded by water, gasses such as oxygen, and some type of molecule in the operating environment. In particular, the properties of the interface between the electrode of the organic EL element and the organic functional layer deteriorate markedly, and the luminescent properties, such as brightness and color, also deteriorate. To prevent such adverse influences, in the case of the organic EL display panel, the organic EL element is sealed with a single inorganic protective film, such as silicon oxide, to restrain its deterioration. However, such a protective film does not have sufficient barrier properties. That is, it is impossible to avoid the generation of pinholes in the inorganic barrier film. When pinholes are formed in the protective film, then water, oxygen or the like can penetrate the film, and a non-luminescent spot of the organic EL element, a so-called dark spot, spreads out.

DISCLOSURE OF INVENTION

It is an object of the present invention to provide an organic EL element and an organic EL display panel having an excellent shielding effect against oxygen, water or the like to protect the organic functional layer and the electrode from them, and having degradation-resistant luminescent properties.

According to the present invention, there is provided an organic electroluminescent display panel comprising:

one or more organic electroluminescent elements each having first and second display electrodes and one or more organic functional layers of organic compounds sandwiched and layered between said first and second display electrodes, the organic functional layers including a light-emitting layer; and a substrate supporting said organic electroluminescent elements;

a high-molecular compound film covering said organic electroluminescent elements and a surface of the substrate around said one or more organic electroluminescent elements; and an inorganic barrier film covering said high-molecular compound film, an edge thereof, and a surface of the substrate around said high-molecular compound film.

In the organic electroluminescent display panel according to the invention, said inorganic barrier film is made of silicon nitride or silicon oxynitride or silicon oxide.

In the organic electroluminescent display panel according to the invention, said inorganic barrier film is formed by a plasma chemical vapor deposition process or a sputter deposition process.

In the organic electroluminescent display panel according to the invention, said high-molecular compound film is formed by a plasma polymerization deposition process or a chemical vapor deposition process.

In the organic electroluminescent display panel according to the invention, said high-molecular compound film is made of polyparaxylylene.

In the organic electroluminescent display panel according to the invention, said substrate is a plastic substrate made of a high-molecular compound.

The organic electroluminescent display panel according to the invention further comprises an inorganic barrier film previously formed on the plastic substrate so as to cover a surface supporting said organic electroluminescent elements on said plastic substrate.

According to the present invention, there is provided method of manufacturing an organic electroluminescent display panel comprising one or more organic electroluminescent elements and a substrate supporting the organic electroluminescent elements, comprising the steps of:

forming one or more organic electroluminescent elements on a substrate, each having first and second display electrodes and one or more organic functional layers of organic compounds sandwiched and layered between said first and second display electrodes, the organic functional layers including a light-emitting layer;

forming a high-molecular compound film having an area larger than a display area including said organic electroluminescent elements so as to cover said organic electroluminescent elements and a surface of the substrate around said one or more organic electroluminescent elements; and forming an inorganic barrier film having an area larger than the area of said high-molecular compound film so as to cover said high-molecular compound film, an edge thereof, and a surface of the substrate around said high-molecular compound film.

In the manufacturing method of the organic electroluminescent display panel according to the invention, the edge of said high-molecular compound film is so formed that said edge becomes gradually thinner.

In the manufacturing method of the organic electroluminescent display panel according to the invention, said inorganic barrier film is made of silicon nitride or silicon oxynitride or silicon oxide.

In the manufacturing method of the organic electroluminescent display panel according to the invention, said inorganic barrier film is formed by a plasma chemical vapor deposition process or a sputter deposition process.

In the manufacturing method of the organic electroluminescent display panel according to the invention, said high-molecular compound film is formed by a plasma polymerization deposition process or a chemical vapor deposition process.

DETAILED DESCRIPTION OF THE INVENTION

The inventor conducted experiments on a two-layer sealed construction comprising a high-molecular compound film and an inorganic barrier film for an organic EL element because an inorganic barrier film cannot seal an organic EL element sufficiently. The experiments were conducted by changing the covering area of the high-molecular compound film and the inorganic barrier film. As a result, it was found that if the edge of the high-molecular compound film near the organic EL element is not covered with the inorganic barrier film, water and oxygen invade through the edge of the exposed high-molecular compound film and propagate in the high-molecular compound film to damage the organic EL element. Therefore, according to the present invention, the edge of the high-molecular compound film is covered with the inorganic barrier film, so water and oxygen cannot enter the organic EL element through the edge of the high-molecular compound film, and the organic EL element is protected.

An exemplary embodiment of the present invention is described below with reference to the accompanying drawings.

Figure 1:
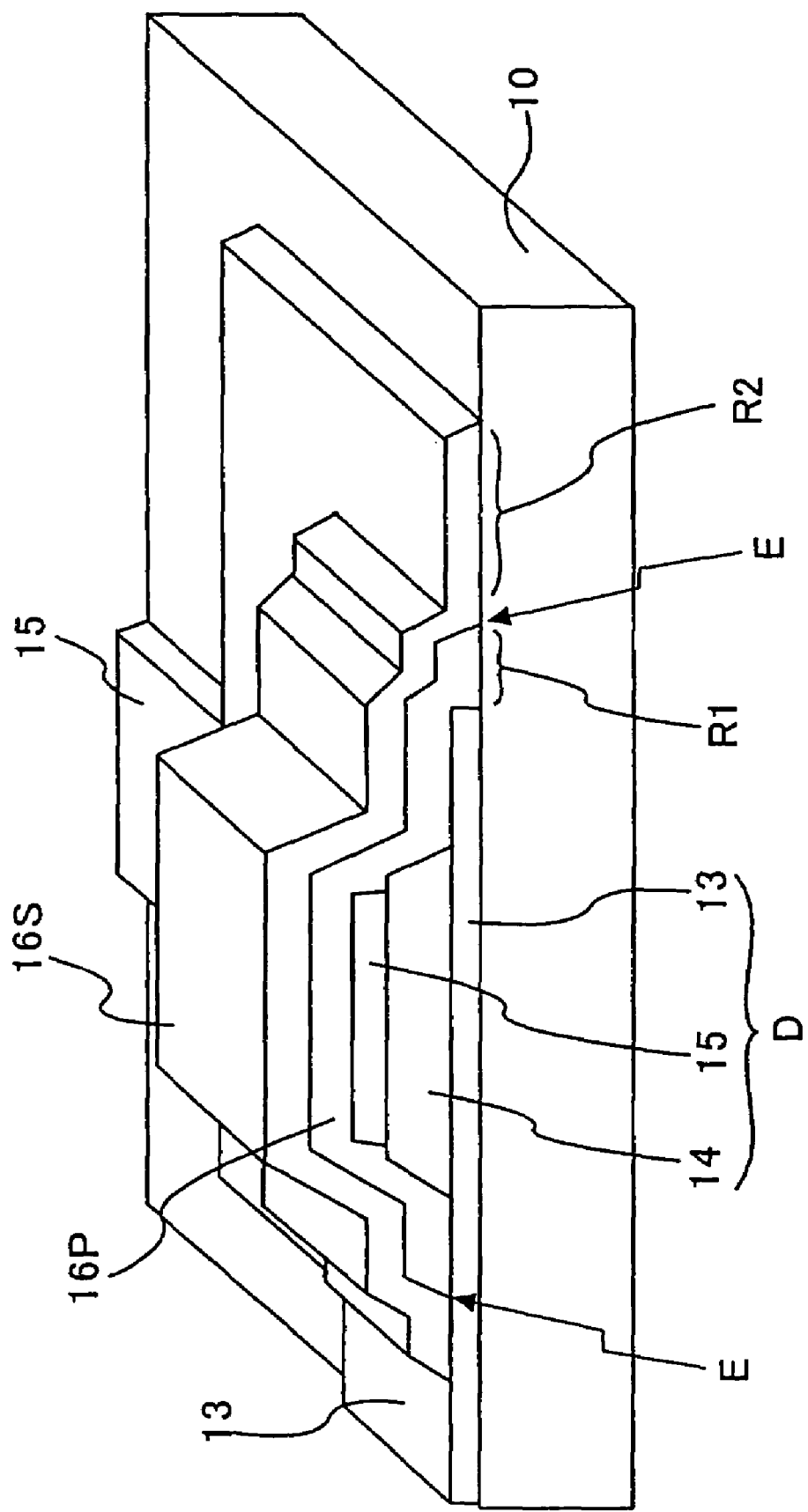
FIG. 1 is a schematic perspective view of an organic EL element according to an embodiment of the present invention.

FIG. 1 shows an organic EL element D according to an embodiment of the present invention. The organic EL element of this embodiment comprises a first display electrode 13 (i.e., anode of a transparent electrode), one or more organic functional layers 14 containing a light-emitting layer of an organic compound or more, and a second display electrode 15 (i.e., cathode of a metallic electrode) formed on a substrate 10 made of glass, or the like. In addition, the organic EL element has a sealing film comprising a high-molecular compound film 16P and an inorganic barrier film 16S so layered that it covers the back of the second display electrode 15. The high-molecular compound film 16P covers the organic EL element D and a surrounding surface R1 of the substrate 10 encircling the organic EL element. The inorganic barrier film 16S covers the high-molecular compound film 16P and its edge E and a further surrounding surface R2 of the substrate 10 encircling the high-molecular compound film. The edge E of the high-molecular compound film 16P is so formed that it becomes gradually thinner so as to ensure the formation of a smooth inorganic surface of the inorganic barrier film 16S. Any material can be used for the substrate 10, so it can be selected from any inorganic material such as glass and any organic material such as a high-molecular compound.

Figure 2:
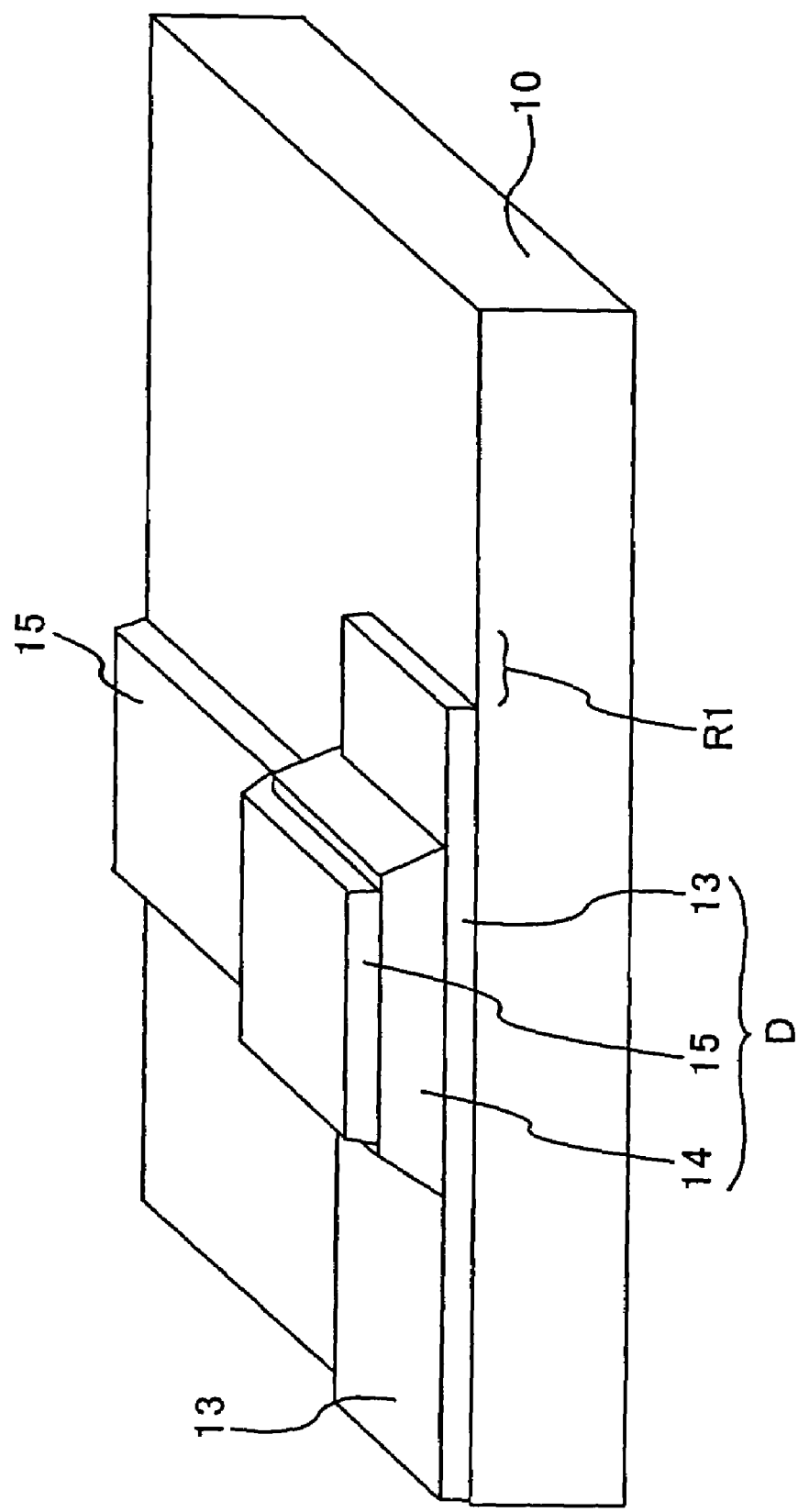
FIGS. 2-4 are schematic perspective views each showing a substrate in the manufacturing process of an organic EL display panel according to the present invention.

For example, as shown in FIG. 2, in a manufacturing process for the organic EL element, the first display electrode 13 consisting of indium-tin oxide (ITO) is evaporated or sputtered on the substrate 10 to form a thin film. The organic functional layers or laminate 14 is formed thereon by evaporating a hole injection layer consisting of copper phthalocyanine, a hole transport layer consisting of TPD (triphenylamine derivative), a light-emitting layer consisting of Alq3 (aluminum chelate complex), and an electron injection layer consisting of $Li_2O$ (lithium oxide) successively. In addition, the second display electrode 15 made of aluminum is formed by evaporation in such a manner that it faces the electrode pattern of the transparent electrode 13 and the organic functional layer 14.

Figure 3:
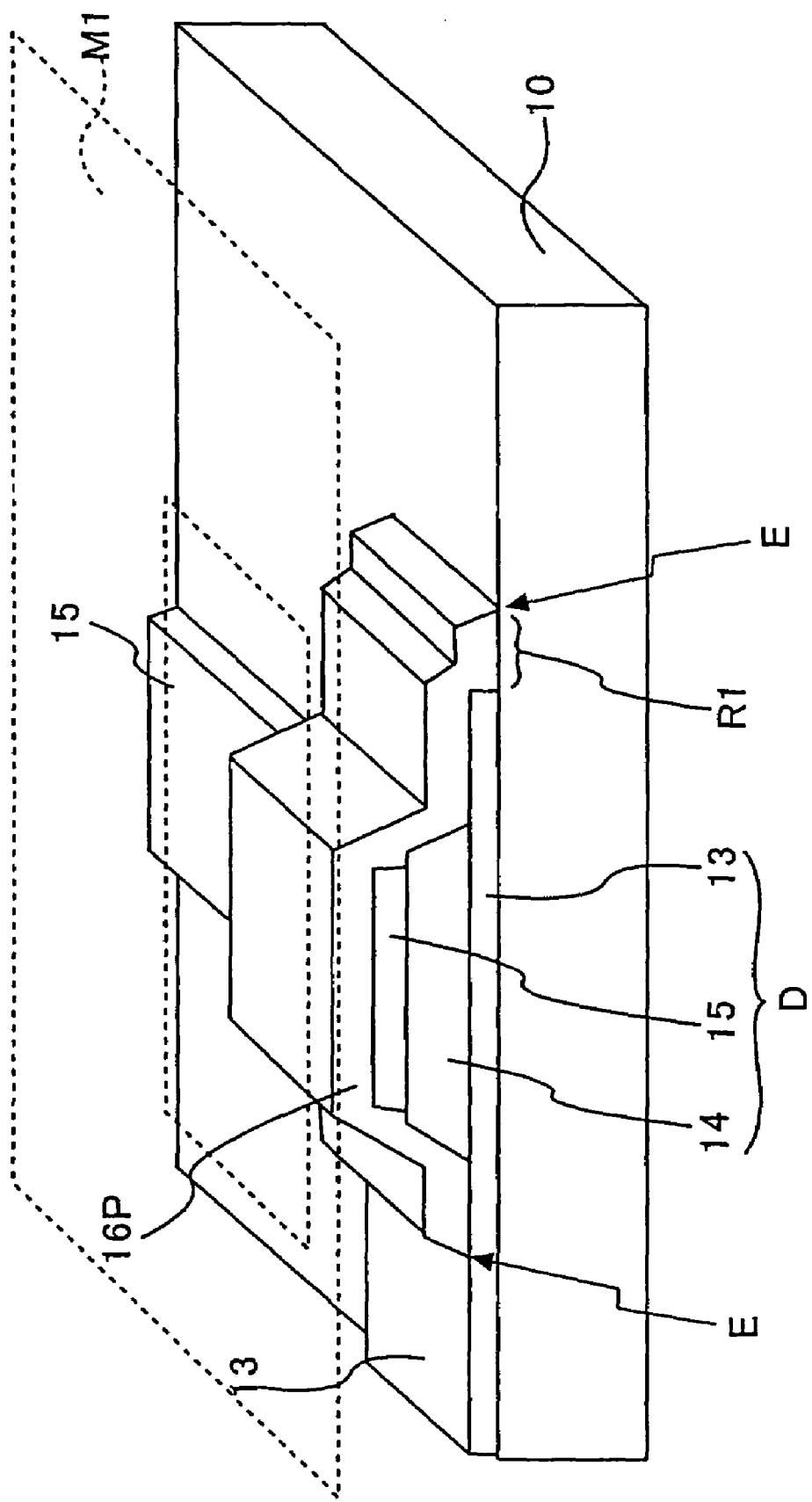

Next, as shown in FIG. 3, a polyparaxylylene film is formed as the high-molecular compound film 16P on the organic EL element by the CVD (chemical vapor deposition) method. In this case, the high-molecular compound film 16P is formed on an area larger than a display area containing pixels or the organic EL element by a first opening mask M1.

Figure 4:
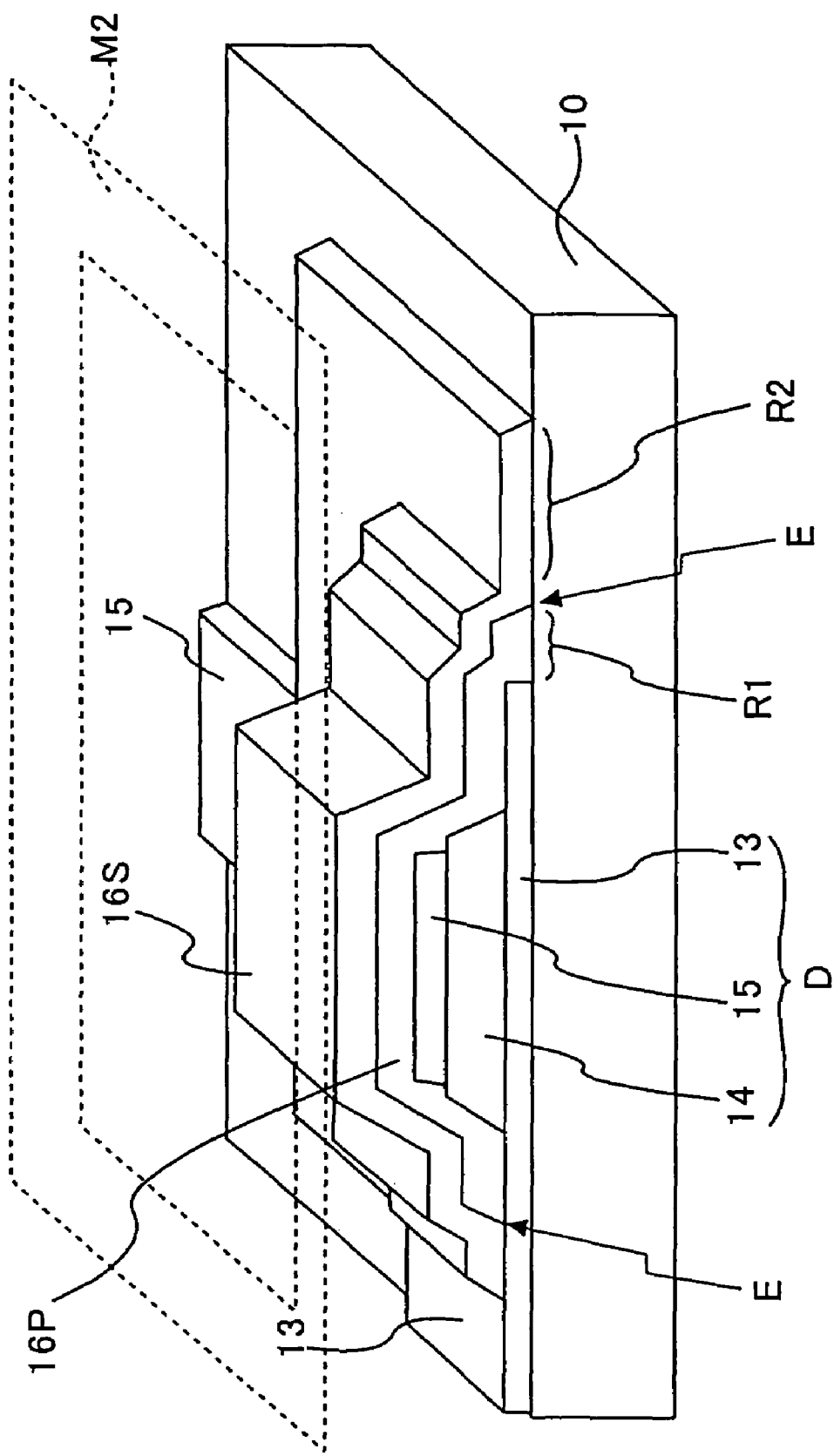

Next, as shown in FIG. 4, a silicon nitride film is formed as the inorganic barrier film 16S on the high-molecular compound film 16P by the plasma CVD (plasma chemical vapor deposition) method. In this case, the organic EL element shown in FIG. 1 is formed by forming the inorganic barrier film 16S over an area larger than that of the high-molecular compound film 16P by means of a second opening mask M2. Because the aperture of second opening mask M2 is larger than that of the first opening mask M1, the inorganic barrier film 16S is so formed that it covers the edge of the high-molecular compound film 16P. A multilayer construction having alternate layer of high-molecular compound film 16P and inorganic barrier film 16S can be formed by repeating the above process.

The plasma polymerizing process for forming the high-molecular compound film 16P is a process in which organic molecules are converted into a plasma state and are polymerized by the coupling of the radicals generated. With the plasma polymerizing process, if a monomer has a vapor pressure, a fine, thin high-molecular compound film can be obtained without using a special polymerizing group such as a vinyl group. According to the embodiment, plasma polymerization is performed in an alternating current plasma polymerizing device. However, a direct-current plasma process using an anode and a cathode may also be used for plasma polymerization.

Examples of the raw material for the high-molecular compound film include a hydrocarbon monomer, such as methane, ethane, propane, butane, pentane, ethylene, propylene, butene, butadiene, acetylene, or methyl acetylene; a silicon monomer, such as hexamethyldisiloxane, triethoxyvinylsilane, polydimethylsiloxane, or tetramethoxysilane; and a hydrogen fluoride monomer, such as tetrafluoroethylene. A high-molecular compound film substantially consisting only of carbon and hydrogen is preferable because it can form a fine, hard film free from pinholes. The ratio of atoms (atomic composition ratio) of H/C=1.5 or smaller is preferable because a three-dimensionally sufficiently cross-linked high-molecular compound film having excellent properties can be formed. Such a high-molecular compound film can be formed by decreasing the amount of the hydrocarbon monomer gas, by reducing the reaction pressure, and by increasing the electric power applied. That is, by reducing the reaction pressure and by increasing the electric power applied, the decomposition energy per monomer unit increases, so decomposition is accelerated and a cross-linked high-molecular compound film can be formed. In addition, a gas, such as hydrogen, inert gas or the like may be used as a carrier gas.

A high-molecular compound film formed by CVD (chemical vapor deposition) is preferable. Because a polyparaxylylene polymerized film, especially, a paraxylylene polymerized film or a chlorinated paraxylylene polymerized film, has extremely low gas and steam permeability, the mixing in of impurities can be restrained and a uniform film with fewer pinholes can be obtained. Examples of such xylene resins are Palylene N (polyparaxylylene), Palylene C (polymonochloroparaxylylene), and Palylene D (polydichloroparaxylylene) commercially available from Union Carbide Co., Ltd. in the U.S.A. Palylene C is preferable because of its low gas permeability. However, Palylene N will do because the SiN film is formed thereon. A high-molecular compound film such as polyparaxylylene film can be obtained by thermally decomposing a gas of a dimer under reduced pressure.

In the experiments, a predetermined organic functional layer was formed on the ITO anode surface of a glass substrate, and an aluminum cathode film was formed thereon to form an organic EL element. Next, a polyethylene high-molecular compound film was formed by plasma polymerization so as to cover the organic EL element. In addition, an inorganic barrier film of silicon nitride was formed on the entire surface thereof by plasma polymerization deposition method so as to cover the edge of the high-molecular compound film and the surrounding surface of the substrate to form an organic EL display panel according to the embodiment. For comparison's sake, an organic EL display panel in which the edge of the high-molecular compound film protruded from the inorganic barrier film was also formed. A 0.5 µm-thick high-molecular compound film was formed by plasma-polymerization from 20 SCCM ethylene gas under the following conditions pressure was 0.9 Torr, RF power was 500 mW/cm$^2$, frequency was 13.56 MHz, and temperature was room temperature. Its durability was tested by measuring the spread of the dark spot of the organic EL element in the atmosphere at 60° C. and 95% RH. According to the embodiment, the dark spot did not spread out, but the test piece for comparison showed the spread of the dark spot.

Figure 5:
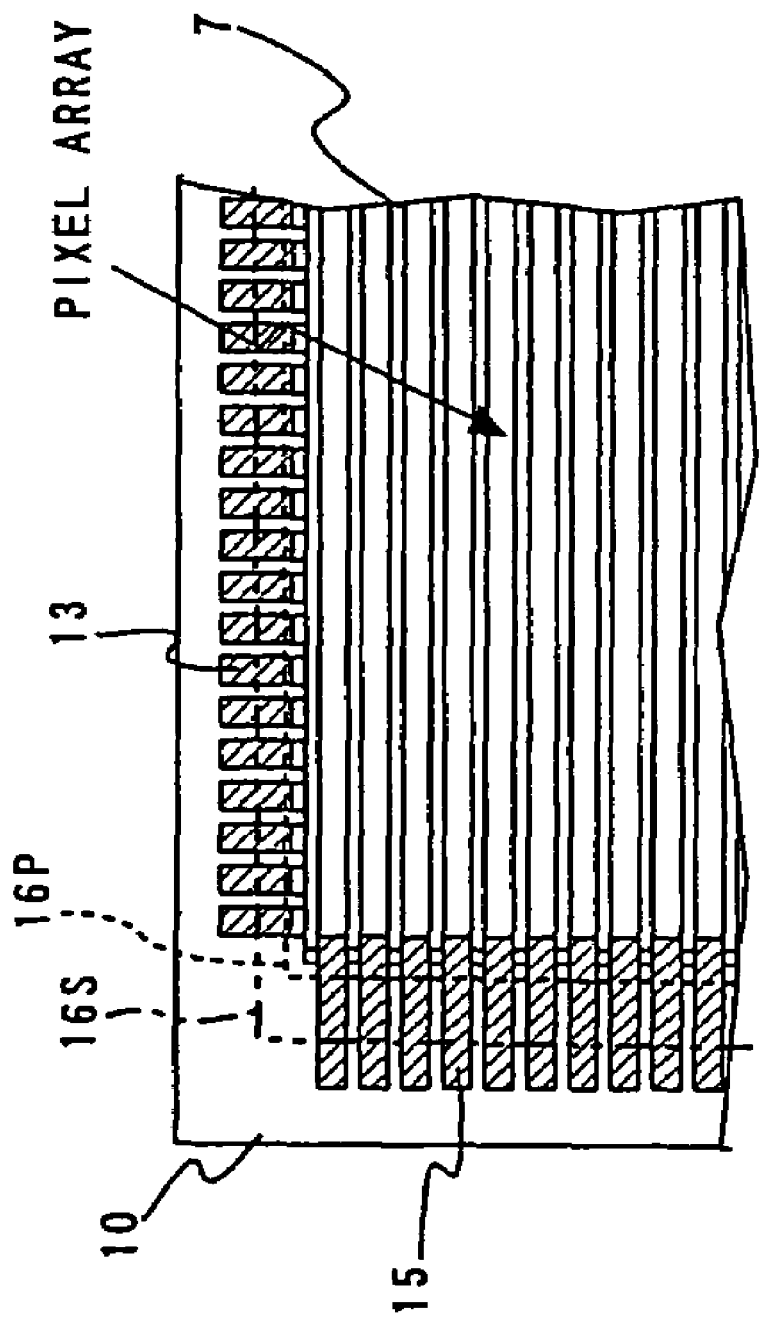
FIG. 5 is a partial enlarged rear view of an organic EL display panel comprising a plurality of organic EL elements according to another embodiment of the present invention.

FIG. 5 is a partial enlarged rear view of an organic EL display panel comprising a plurality of organic EL elements. The organic EL display panel comprises a plurality of organic EL elements arranged in the form of a matrix on the substrate 10. A row-electrode 13 (a first display electrode of the anode) including a transparent electrode layer, an organic functional layer, and a column electrode 15 (a second display electrode) including a metallic electrode layer intersecting with said row electrode are formed successively on the substrate 10. Each row electrode is formed in the form of a band and arranged so that it is parallel with an adjacent row electrode with a predetermined interval between them. The same is true of the column electrodes. As described above, the display panel of the matrix display type has a picture display array comprising luminescent pixels of a plurality of organic EL elements formed at intersections of a plurality of rows and a plurality of columns. The organic EL display panel may comprise a plurality of partition walls 7 installed in parallel between the organic EL elements arranged on the substrate 10. The high-molecular compound film 16P and the inorganic barrier film 16S are formed on the second display electrode 15 and the partition wall 7 so as to cover a plurality of organic EL elements. Luminescent spots of red R, green G and blue B may be formed by selecting and laminating organic functional layer materials appropriately.

Figure 6:
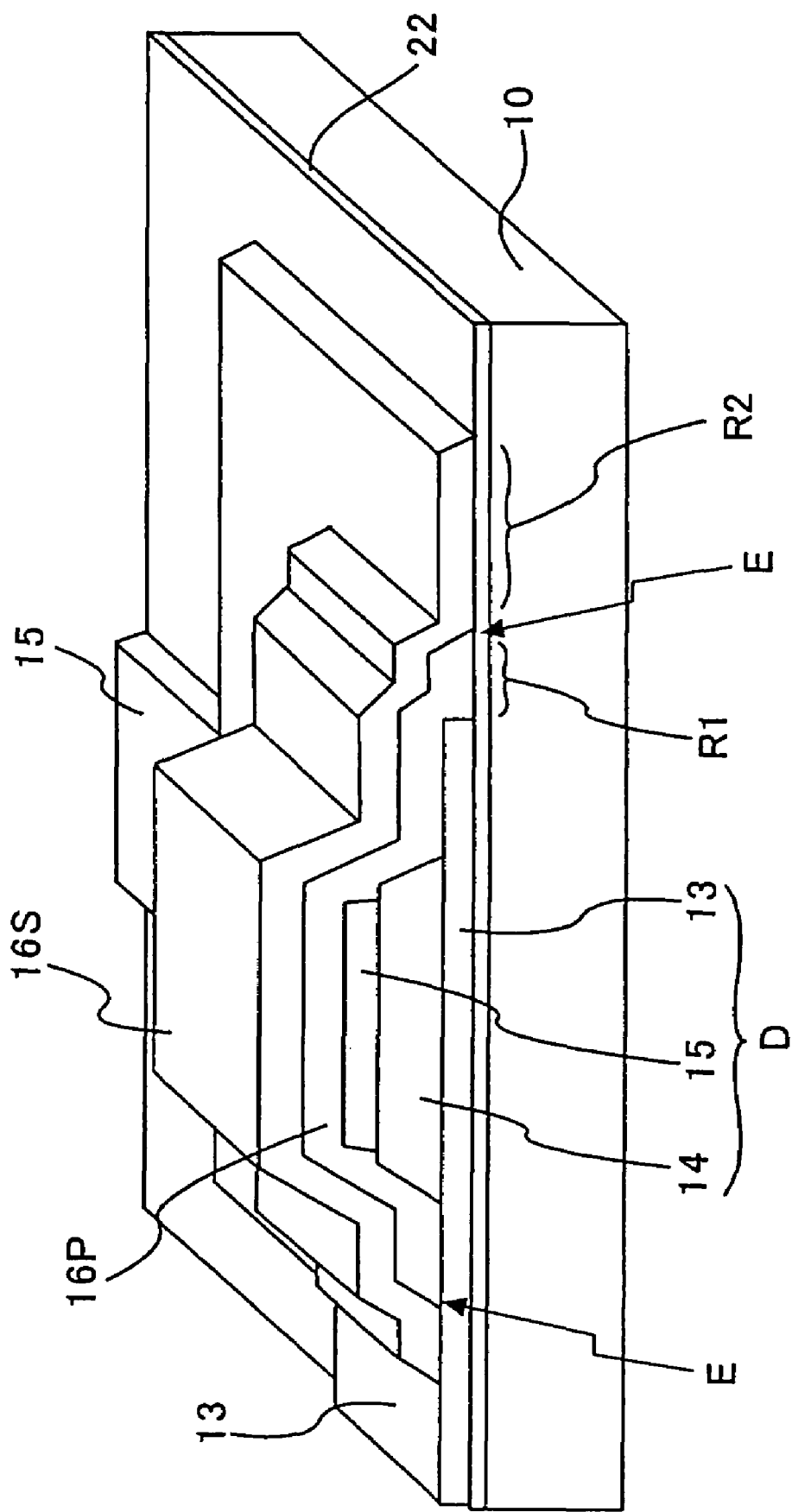
FIG. 6 is a schematic perspective view of an organic EL element according to another embodiment of the present invention.

FIG. 6 shows an organic EL element according to another embodiment of the present invention. This organic EL element is the same as that of the embodiment in FIG. 1 except that the substrate 10 is made of plastic using synthetic resin, and its surface is covered with an inorganic barrier film 22 on the substrate consisting of an inorganic material, such as silicon nitride or silicon oxynitride or silicon oxide. An organic EL element electrode is formed on the inorganic barrier film 22 on the substrate. As the synthetic resin substrate, a film of polyethylene terephthalate, polyethylene-2,6-naphthalate, polycarbonate, polysulfone, polyethersulfone, polyether ether ketone, polyphenoxyether, polyalylate, fluororesin, polypropylene or the like can be applied.

It is preferable that the surface of the plastic substrate covered with the inorganic barrier film 22 on the substrate includes at least a surface in contact with the organic EL elements, a surface between the organic EL elements, a surface around the organic EL elements, and a surface on the reverse side of the surface in contact with the organic EL elements. These surfaces can prevent the invasion of outgas or the like from the plastic substrate into the organic functional layer. Warping of the plastic substrate can be prevented by covering both sides of the plastic substrate with the inorganic barrier film 22 on the substrate.

The above-mentioned embodiment employs plasma CVD as the inorganic barrier film forming process. However, any vapor deposition method, such as sputter deposition or vacuum evaporation may be used, if so desired.

In the case of the above-mentioned embodiment, the organic EL display panel of the simple matrix display type was described. The present invention is also applicable to any panel substrate of the active matrix display type using TFT (thin film transistors) or the like.

According to the present invention, it is possible to prevent the invasion of water and oxygen through the edge of the high-molecular compound film, and a sealing construction with an efficient sealing effect against water and oxygen can be achieved, so the organic EL element is sufficiently protected. Therefore, a highly durable organic EL display panel can be provided. In addition, a highly reliable organic EL display panel can be provided by covering the edge of the high-molecular compound film of a multilayer protective film with a protective film of inorganic barrier film.

The invention claimed is:

1. An organic electroluminescent display panel comprising:
   one or more organic electroluminescent elements each having first and second display electrodes and one or more organic functional layers of organic compounds sandwiched and layered between said first and second display electrodes, the organic functional layers including a light-emitting layer;
   a substrate supporting said organic electroluminescent elements;
   a polymer compound film covering said organic electroluminescent elements and a surface of the substrate around said one or more organic electroluminescent elements wherein said polymer compound film is a paraxylylene polymerized film or a chlorinated paraxylylene polymerized film; and an inorganic barrier film covering said polymer compound film, an edge thereof, and a surface of the substrate around said polymer compound film, wherein said inorganic barrier film is made of silicon nitride or silicon oxynitride or silicon oxide, wherein the edge of said polymer compound film is so formed that said edge becomes gradually thinner, and wherein the first and second display electrodes have ends uncovered with said inorganic barrier film.

2. The organic electroluminescent display panel according to claim 1, wherein said substrate is a plastic substrate made of a polymer compound.

3. The organic electroluminescent display panel according to claim 2, further comprising an inorganic barrier film made of an inorganic compound and previously formed on the plastic substrate so as to cover a surface supporting said organic electroluminescent elements on said plastic substrate.

* * * * *